United States Patent
Bower

(10) Patent No.: US 7,094,667 B1
(45) Date of Patent: Aug. 22, 2006

(54) SMOOTH THIN FILM LAYERS PRODUCED BY LOW TEMPERATURE HYDROGEN ION CUT

(76) Inventor: Robert W. Bower, 861 Southwood Blvd., #20, Incline Village, NV (US) 89451

( * ) Notice: Subject to any disclaimer, the term of this patent is extended or adjusted under 35 U.S.C. 154(b) by 0 days.

(21) Appl. No.: 10/431,635

(22) Filed: May 5, 2003

Related U.S. Application Data

(63) Continuation of application No. 10/033,729, filed on Dec. 28, 2001, now abandoned.

(60) Provisional application No. 60/259,061, filed on Dec. 28, 2000.

(51) Int. Cl.
  *H01L 21/00* (2006.01)
(52) U.S. Cl. .................................... 438/458
(58) Field of Classification Search ................ 438/455, 438/458
See application file for complete search history.

(56) References Cited

U.S. PATENT DOCUMENTS

| | | |
|---|---|---|
| 5,374,564 A | 12/1994 | Bruel |
| 5,494,835 A | 2/1996 | Bruel |
| 5,710,057 A | 1/1998 | Kenney |
| 6,027,988 A | 2/2000 | Cheung et al. |
| 6,048,411 A | 4/2000 | Henley et al. |
| 6,054,370 A | 4/2000 | Doyle |
| 6,069,059 A | 5/2000 | Pan et al. |
| 6,124,185 A | 9/2000 | Doyle |
| 6,140,210 A | 10/2000 | Aga et al. |
| 6,150,239 A | 12/2000 | Goescle et al. |
| 6,159,824 A | 12/2000 | Henley et al. |
| 6,162,705 A | 12/2000 | Henley et al. |
| 6,245,249 B1 | 1/2001 | Yamada et al. |
| 6,191,007 B1 | 2/2001 | Matsui et al. |
| 6,225,190 B1 | 5/2001 | Bruel et al. |
| 6,225,192 B1 | 5/2001 | Aspar et al. |
| 6,290,804 B1 | 9/2001 | Henley et al. |
| 6,346,458 B1 | 2/2002 | Bower |

OTHER PUBLICATIONS

Moriceau et al., "Cleaning and polishing as key steps for Smart-cut® SOI proces", Oct. 1996, Proceedings of the 1996 IEEE SOI Conference, pp. 152-153.*
Cioccio et al., "Silicon carbide on insulator formation using Smart Cut process", Jun. 1996, Electronics Letters, vol. 32, No. 12, pp. 1144-1145.*
Bruel, "Silicon on insulator technology", Jul. 1995, Electronics Letters, vol. 31, No. 14, pp. 1201-1202.*
Tong, Q.-Y. and Bower, R.W.; "Beyond 'Smart-Cut': Recent Advances in Layer Transfer for Material Integration," MRS Bulletin, vol. 23, No. 12, pp. 40 thru 43, Dec. 1998.
Lu, X. et al.; "SOI Material Technology Using Plasma Immersion Ion Implantation," Proceedings 1996 IEEE International SOI Conference, pp. 48 & 49, Oct. 1996.

(Continued)

*Primary Examiner*—Evan Pert
(74) *Attorney, Agent, or Firm*—John P. O'Banion

(57) ABSTRACT

A method for producing wafer splitting from ion implantation into silicon after low temperature direct bonding with surface roughness that is ~1 nm (RMS). This result is an order of magnitude smoother than the previous work (~10 nm RMS). The key improvement in this work is the use of a low temperature bond resulting in a strong bond before the material is cut. The smooth as-split surfaces produced using a low temperature bond are very important for creation of very thin (<50 nm) silicon-on-insulator (SOI), three-dimensional bonded structures and nanostructures that are split after processing.

21 Claims, 1 Drawing Sheet

OTHER PUBLICATIONS

Freund, L.B.; "A Lower Bound on Implant Density to Induce Wafer Splitting in Forming Compliant Substrate Structures," Applied Physics Letters, vol. 70, No. 26, Jun. 30, 1997.

Tong, Q.-Y. et al.; "Layer Splitting Process in Hydrogen Implanted Si, Ge, SiC, and Diamond Substrates," Applied Physics Letters, vol. 70, No. 11 Mar. 17, 1997.

Aspar, B. et al.; "Transfer of Structured and Patterned Thin Silicon Films Using the Smart-Cut Process," Electronics Letters, vol. 32, No. 21, pp. 1985 & 1986, Oct. 10, 1996.

Auberton-Herve, A.J.; "SOI: Materials to Systems," pp. IEDM 96-3 thru IEDM 96-10 IEEE, (1996).

http://www.research.ibm.com/ionbeams/home.htm; "Ion Beam Interactions With Matter," The Shopping and Range of Ions in Matter, pp. 1-5, Jan. 1998.

Yun, C.H. et al.; "Transfer of Patterned Ion-Cut Silicon Layers," Appl. Phys. Lett., vol. 73, No. 19, pp. 2772-2774, Nov. 9, 1998.

Bower, R. W. et al.; The Hydrogen Ion Cut Technology Combined With low Temperture direct bonding, Proceedings SPIE vol. 3184, pp. 1 thru 3, (1997).

Tong, Q.-Y. et al.; "Low Temperature Si Layer Splitting," Proceedings 1997 IEEE International SOI Conference, pp. 126-127, Oct. 1997.

Hara, T. et al.; "Delaminations of Thin Layers by High Dose Hydrogen Ion Implantation in Silicon," Journal of Electrochemical Society, vol. 143, No. 8, pp. L166 thru L168, Aug. 1996.

Li, Y. Albert et al.; "Surface Roughness of Hydrogen Ion Cut Low Temperature Bonded Thin Film Layers," Journal of Applied Physics, vol. 39, Part 1, No. 1, pp. 275-276, Jan. 2000.

Bower, R.W. et al.; "Transposed Splitting of Silicon Implanted Hydrogen and Boron With Offset Distributions," ECE Department, University of California, Davis, CA 95616, pp. 1-3, II Nuovo Cimento, vol. 19D, No. 12, 1871-1873 Jan. 1, 1998.

Agarwal, A. et al.; "Efficient Production of Silicon-On-Insulator Films by Co-Implantation of He+ With H+," Proceedings of 1997 IEEE International SOI Conference, pp. 44-45, Oct. 1997.

Van Wieringen, A. et al.; "On the Permeation of Hydrogen and Helium in Single Crystal Silicon and Germanium at Elevated Temperatures," Physic XXII, pp. 849-865 (1956).

Cerofolini, G.F. et al.; "Hydrogen Precipitation in Highly Overstaturated Single-Crystalline Silicon," Phyica Status Solidi, vol. 150, pp. 539-585, (1995).

Bruel, M.; "Silicon on Insulator Material Technology," Electronics Letters, vol. 31, No. 14, Jul. 6, 1995.

Marwick, A.D. et al.; "High Hydrogen Concentrations Produced by Segregation into P+ Layers in Silicon," Applied Physics Letters, vol. 59, No. 2, pp. 198-200, Jul. 8, 1991.

Bower, R.W. et al., Low temperature Si3N4 direct bonding, App. Phys. Lett., Jun. 1993, vol. 62, No. 26, pp. 3485-3487.

* cited by examiner

SMOOTH THIN FILM LAYERS PRODUCED BY LOW TEMPERATURE HYDROGEN ION CUT

CROSS-REFERENCE TO RELATED APPLICATIONS

This application is a continuation of U.S. application Ser. No. 10/033,729 filed on Dec. 28, 2001 now abandoned, incorporated herein by reference, which claims priority from U.S. provisional application Ser. No. 60/259,061 filed on Dec. 28, 2000, incorporated herein by reference.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Field of the Invention

The present invention pertains generally to the formation of silicon-on-insulator (SOI) layers for semiconductor fabrication, and more particularly to the formation of SOI layers by using a hydrogen ion cut that follows a low temperature direct bond.

INCORPORATION BY REFERENCE

The following publications, some of which are referred to herein using their corresponding number inside a square bracket (e.g., [1]), are incorporated herein by reference herein as background information for this application:
1. M. Bruel: Nucl. Instrum. & Methods Phys. Res. B 108 (1996) 313.
2. A. J. Auberton-Herve, M. Bruel, B. Aspar, C. Maleville and H. Moriceau: IEICE Trans. Electron. E80-C (1997) 358.
3. B. Aspar. M. Bruel, H. Moriceau, T. Poumeyrol and A. M. Papon: Microelectron. Eng. 36 (1997) 233.
4. C. Maleville, 3. Aspar, T. Poumeyrol, H. Moriceau, M. Bruel, A. J. Auberton-Herve and T. Barge: Mater. Sci. & Eng. B 46 (1997) 14.
5. M. Bruel, B. Aspar and A. J. Auberton-Herve: Jpn. J. Appl. Phys. 36 (1997) 1636.
6. R. W. Bower, Y, A. Li and F. Y.-J, Chin: Proc. SPIE 3184 (1997).
7. R. W. Bower, M. S. Ismail and B. E. Roberds: Appl. Phys. Lett. 62 (1993) 3485.
8. V. H. C. Watt and R. Bower: Electron. Lett. 30 (1994) 693.
9. R. W. Bower, W. Chan, L. Hong, L. LeBoeuf, Y. A. Li and J. Lee: Tech. Dig. Solid-State Sensor and Actuator Workshop, Hilton Head, S.C., June 1996.
10. Y. Albert Li and Robert W. Bower, Jpn. J. Appl. Phys. Phys. Vol. 39 (2000) pp. 275–276.
11. T. Hara, T. Onda, Y. Kakizaki, S. Oshima. T. Kitamura. K. Kajiyama, T. Yoneda, K. Sekine and M. Inoue: J. Electrochem. Soc. 143 (1996) L166.
12. R. W. Bower and E Y.-J. Chin: Jpn, J. Appl. Phys. 36 (1997) L527.
13. Y. A. Li and R. W. Bower: Proc. SPIE 3184 (1997) 124.
14. Y. A. Li and R. W. Bower: Jpn, J. Appl. Phys. 37 (1998) 737.
15. Q.-Y. Tong, T.-H. Lee, L.-J. Huang, Y.-L. Chao and U. Goesele: Proc. 1997 IEEE Int. SOI Conf., October 1997, p. 126.
16. Q.-Y Tong and U. Goesele: Mater. Chem. & Phys. 37 (1994) 101.
17. Q.-Y Tong and R. W. Bower: Beyond "Smart-Cut®": Recent Advances in Layer Transfer for Material Integration, MRS Bulletin, Dec. 1998, pp. 40–43.

DESCRIPTION OF THE BACKGROUND ART

Methods of producing silicon-on-insulator (SOI) include separation by ion implantation of oxygen (SIMOX), bond and etch-back SOI (BESOI) and more recently ion cut (Smart-Cut®). These three techniques are compared and reviewed in a recent article by Bruel [1]. However, it is clear that all three techniques as described require processing temperatures >1,000° C. Past literature on the hydrogen ion cut technology (Smart-Cut®) has followed a procedure where hydrophilic materials are bonded at room temperature to form a weak bond. The weakly bonded pair is then heated to 400° C. to 600° C. to cut the material and transfer a thin film to a new host substrate, and finally the bond is strengthened with an anneal of >1,000° C. to form SOI [1]. Later work does not explain how the bond can be strengthened without the subsequent high temperature anneal [2–5].

As pointed out in Bruel's work, it is desirable to establish a strong stiffener during the material cut [1,2]. The stiffener formed in Bruel's work is not strong when the material is cut at temperatures of 400° C. to 600° C. Thus, a strong stiffener is not in place when the material is cut, and a rough surface results.

BRIEF SUMMARY OF THE INVENTION

The present invention generally comprises a method for creating expunged, smooth thin layers of material directly from an ion cut process. More particularly, according to the present invention, a first material is implanted with ions to define a cut line, the first material is then low temperature bonded to a second material, and the first material is then ion cut to expunge a thin layer of the first material bonded to the second material. The method is particularly suitable for forming silicon-on-insulator (SOI) layers.

Preferably the thin layer of the first material is formed by using a hydrogen ion cut following the low temperature direct bond. In this case, a bond >1,000 ergs/cm$^2$ is produced with a low temperature bond at a temperature equal to or less than 200° C. Thus, a strong bond is in place that provides a strong stiffener during the cut that is often formed at 420° C. Examples of results of this process can be found in Y. Albert Li and Robert W. Bower, Jpn. J. Appl. Phys. Phys. Vol. 39 (2000) pp. 275–276 [10].

By way of example, and not of limitation, the inventive method to accomplish this smooth ion cut is as follows. First, ion implantation or other methods (such as described in my copending U.S. application Ser. No. 09/476,456 filed on Dec. 30, 1999, now U.S. Pat. No. 6,346,458, incorporated herein by reference) are used to inject a suitable dose of ions such as hydrogen into the first material. The injected ions thus form a cut line in the first material. Next, the first material is strongly bonded to a second material at a temperature lower than required to expunge the thin layer of material [6–9]. Such a bond may be produced by the low temperature bonding procedures known in the art or suitable organic adhesives that are also known in the art [6–9]. Finally, the thin layer is expunged with an ion cut completed with the strong bond in place. This ion cut expunges the thin layer from the first material and leaves this layer attached by the bonds described to the second material.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1A:
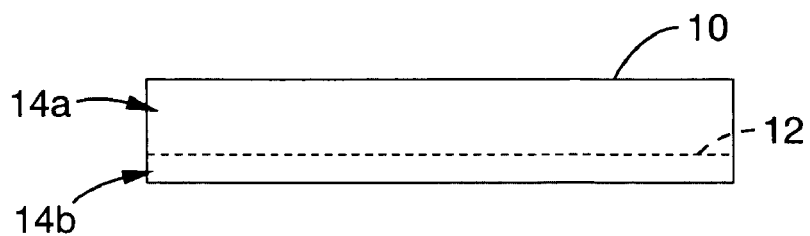
FIG. 1A through FIG. 1C is a flow diagram of a method for forming a thin layer of one material on a second material using low temperature bonding and ion cutting according to the present invention.
Figure 1B:
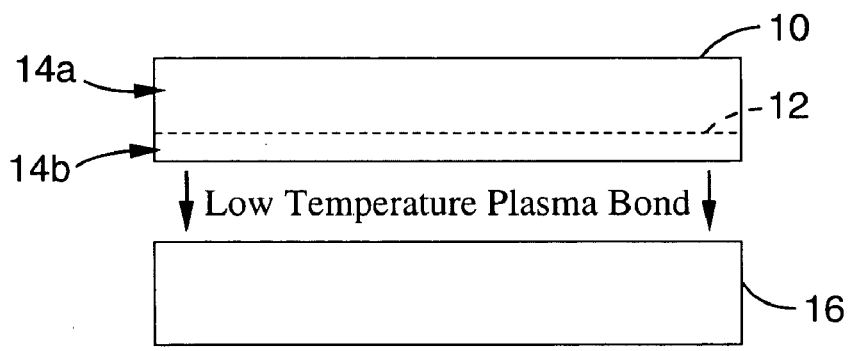
Figure 1C:
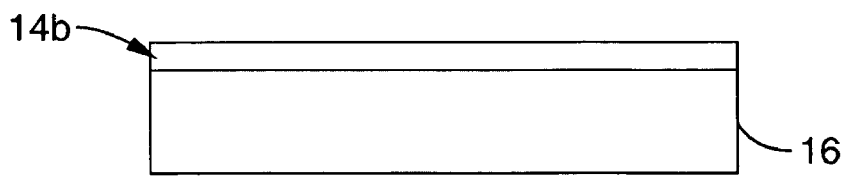

FIG. 1A through FIG. 1B show the steps for forming a smooth, thin layer of a first material that is low temperature bonded to a second material according to the present invention. Referring first to FIG. 1A, in accordance with the present invention a first material 10 is injected with ions represented by the dashed line 12. The preferred implantation technique is to ion implant hydrogen with a dose of approximately $5\times10^{16}$ to approximately $1\times10^{17}$ ions/cm$^2$ at room temperature with energies in the range of approximately 22 KeV to approximately 100 KeV. The ion implantation line 12 defines a cut line between segments 14a, 14b in first material 10. Next, as shown in FIG. 1B and FIG. 1C, ion implantation is then followed by formation of a low temperature bond to a second material 16, preferably using a plasma surface treatment with oxygen as described in the literature [6–14]. Finally, as shown in FIG. 1C, first material 10 is cut along ion implantation line 12 to expunge a thin, smooth layer 14b of first material 10 attached to second material 16 by the strong low temperature bond. The thin layer 14b is expunged by various methods known in the art. The strength of bonds formed with conventional high temperature direct bonding are also known in the literature [15–16].

It will be appreciated that the materials used, the energy range, dose and even the species of ion implanted in no way is limited by this preferred embodiment, and those skilled in the art will appreciate that those details can vary without departing from the invention described herein. For example, materials can include silicon, Ge, GaAs, etc., low temperature bonding can be O$_2$ or NH$_3$ plasma bonding or wet chemical methods, and ions can be injected by various means including ion implantation of H, He, and other ions.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for producing smooth thin film layers, comprising:

implanting a first material with ions to define a cut line in a first material;

bonding said first material to a second material with a low temperature bond at a temperature equal to or less than 200° C.; and ion cutting said first material along said cut line to expunge a layer of said first material bonded to the second material;

wherein said first material is bonded to said second material using low temperature plasma bonding.

2. A method as recited in claim 1, wherein said first material is implanted with hydrogen ions with a dose of between approximately $5\times10^{16}$ and approximately $1\times10^{17}$ ions/cm$^2$ at room temperature with energies in the range between approximately 22 KeV and approximately 100 KeV.

3. A method as recited in claim 1, wherein at least one of said first and second materials is selected from the group of materials consisting essentially of Si, Ge, and GaAs.

4. A method as recited in claim 1, wherein said plasma bonding is selected from the group consisting essentially of O$_2$ plasma bonding and NH$_3$ plasma bonding.

5. A method for producing smooth thin film layers, comprising:

implanting a first material with ions to define a cut line in said first material;

bonding said first material to a second material with a low temperature bond at a temperature equal to or less than 200° C.; and expunging a layer of said first material bonded to said second material with an ion cut;

wherein said first material is bonded to said second material using low temperature plasma bonding.

6. A method as recited in claim 5, wherein said first material is implanted with hydrogen ions with a dose of between approximately $5\times10^{16}$ and approximately $1\times10^{17}$ ions/cm$^2$ at room temperature with energies in the range between approximately 22 KeV and approximately 100 KeV.

7. A method as recited in claim 5, wherein at least one of said first and second materials is selected from the group of materials consisting essentially of Si, Ge, and GaAs.

8. A method as recited in claim 5, wherein said plasma bonding is selected from the group consisting essentially of O$_2$ plasma bonding and NH$_3$ plasma bonding.

9. A method for producing smooth thin film layers, comprising:
- implanting a first material with hydrogen ions with a dose of between approximately $5\times10^{16}$ and approximately $1\times10^{17}$ ions/cm$^2$ at room temperature with energies in the range between approximately 22 KeV and approximately 100 KeV to define a cut line in said first material;
- bonding said first material to a second material using low temperature plasma bonding at a temperature equal to or less than 200° C.; and
- expunging a layer of said first material bonded to said second material with an ion cut.

10. A method as recited in claim 9, wherein at least one of said first and second materials is selected from the group of materials consisting essentially of Si, Ge, and GaAs.

11. A method as recited in claim 9, wherein said low temperature plasma bonding is selected from the group consisting essentially of O$_2$ plasma bonding and NH$_3$ plasma bonding.

12. A method for producing smooth thin film layers, comprising:
- injecting a dose of ions into a first material, wherein said ions form a cut line in said first material;
- bonding said first material to a second material at a temperature lower than required to expunge a layer of said first material along said cut line;
- said temperature being equal to or less than 200° C.; and
- using an ion cut, expunging a layer of said first material bonded to said second material;
- wherein said first material is bonded to said second material using low temperature plasma bonding.

13. A method as recited in claim 12, wherein said first material is implanted with hydrogen ions with a dose of between approximately $5\times10^{16}$ and approximately $1\times10^{17}$ ions/cm$^2$ at room temperature with energies in the range between approximately 22 KeV and approximately 100 KeV.

14. A method as recited in claim 12, wherein at least one of said first and second materials is selected from the group of materials consisting essentially of Si, Ge, and GaAs.

15. A method as recited in claim 12, wherein said low temperature plasma bonding is selected from the group consisting essentially of O$_2$ plasma bonding and NH$_3$ plasma bonding.

16. A method for producing smooth thin film layers by low temperature ion cut, comprising:
- injecting into a first material a dose of hydrogen ions between approximately $5\times10^{16}$ and approximately $1\times10^{17}$ ions/cm$^2$ at room temperature with energies in the range between approximately 22 KeV and approximately 100 KeV, wherein said ions form a cut line in said first material;
- using plasma bonding, bonding said first material to a second material at a temperature lower than required to expunge a layer of said first material along said cut line; and
- using an ion cut, expunging a layer of said first material bonded to said second material.

17. A method as recited in claim 16, wherein at least one of said first and second materials is selected from the group of materials consisting essentially of Si, Ge, and GaAs.

18. A method as recited in claim 16, wherein said plasma bonding is selected from the group consisting essentially of O$_2$ plasma bonding and NH$_3$ plasma bonding.

19. A method for producing smooth thin film layers by low temperature ion cut, comprising:
- injecting a first material with hydrogen ions with a dose of approximately $5\times10^{16}$ to approximately $1\times10^{17}$ ions/cm$^2$ at room temperature with energies in the range of approximately 22 KeV to approximately 100 KeV;
- said injected ions defining a cut line between segments in said first material;
- forming a low temperature plasma bond between said first material and a second material; and
- cutting said first material along said cut line to expunge a thin, smooth layer of said first material attached to second material by said low temperature bond.

20. A method as recited in claim 19, wherein at least one of said first and second materials is selected from the group of materials consisting essentially of Si, Ge, and GaAs.

21. A method as recited in claim 19, wherein said low temperature plasma bond is selected from the group consisting essentially of an O$_2$ plasma bond and an NH$_3$ plasma bond.

* * * * *